United States Patent [19]
Cressman et al.

[11] 3,965,276
[45] June 22, 1976

[54] POLYMERIZATION IMAGING

[75] Inventors: Paul J. Cressman, Fairport; William W. Limburg, Penfield, both of N.Y.; Louis A. Pilato, Bound Brook, N.J.

[73] Assignee: Xerox Corporation, Stamford, Conn.

[22] Filed: Jan. 7, 1975

[21] Appl. No.: 539,147

Related U.S. Application Data

[60] Division of Ser. No. 248,770, April 28, 1972, Pat. No. 3,879,275, which is a continuation of Ser. No. 858,062, Sept. 15, 1969, abandoned.

[52] U.S. Cl. ............................... 427/12; 427/271
[51] Int. Cl.² ........................................ G03G 17/00
[58] Field of Search ............ 204/180 R, 181 R, 165, 204/14, 23, 168; 427/12, 271

[56] References Cited
UNITED STATES PATENTS

| | | | |
|---|---|---|---|
| 2,551,035 | 5/1951 | Miller | 204/165 |
| 3,155,629 | 11/1964 | Tobin et al. | 204/168 |
| 3,318,790 | 5/1967 | Carbojal et al. | 204/168 |
| 3,321,391 | 5/1967 | Warfield et al. | 204/165 |
| 3,475,307 | 10/1969 | Knox et al. | 204/168 |

*Primary Examiner*—Bernard D. Pianalto
*Attorney, Agent, or Firm*—James J. Ralabate; Michael H. Shanahan; George J. Cannon

[57] ABSTRACT

A liquid to solid addition polymerization imaging method comprises providing between two electrodes, one of which is in imagewise configuration, a polymerizable composition comprising unsaturated vinyl containing compounds; and, in the absence of chemical initiators, catalysts and electrolytes, applying an imagewise configured electrical field across the composition to polymerize the composition.

8 Claims, 2 Drawing Figures

POLYMERIZATION IMAGING

This is a division of application Ser. No. 248,770, filed Apr. 28, 1972, now U.S. Pat. No. 3,879,275, which in turn, is a continuation of application Ser. No. 858,062, filed Sept. 15, 1969, now abandoned.

BACKGROUND OF THE INVENTION

This invention relates in general to polymerization and in particular to charge injection polymerization.

Addition polymerization of polymerizable unsaturated organic compounds is accomplished in a variety of ways. The most common method for effecting the polymerization of unsaturated organic compounds, such as vinyl polymers or vinyl monomers, is to react them chemically in the presence of a peroxide catalyst at elevated temperatures. Polymerization is initiated by the thermal decomposition of the peroxide catalyst which provides a free radical. Thermal decomposition of an initiator has disadvantages in that heat is required and the rate of generation of free radicals cannot be closely controlled because of the heat capacity of the system.

Another method for effecting the polymerization of unsaturated compounds is by irradiation. Light of short enough wavelength, i.e., high enough energy per quantum can initiate polymerization directly. It is customary, however, to use a photochemical initiator to increase the rate of polymerization. Radiation induced polymerization has disadvantages in that it is much slower than thermally induced polymerization and requires high energy light sources, such as ultraviolet rays of the type emanating from sunlight or a carbon arc lamp.

Another method of polymerizing unsaturated organic compounds is through the use of electric discharge in which the monomer is polymerized by the discharge of electricity through monomer vapors. See, for example, U.S. Pat. No. 2,632,729 to Woodman. This system, however, requires that the monomer be a vapor at the operating temperature of the system or be vaporized before introduction into the system. High energy electrons are also used to cross-link polymeric solid materials, such as, polyethylene or polystyrene. This type of cross-linking, called curing, has beneficial effects on the mechanical properties of these polymers. However, this system requires a polymeric solid as a starting material and very high energy electron sources.

Liquid phase electric field polymerization of unsaturated organic compounds is also known in the art. For example, acrylonitrile, methyl methacrylate, vinyl acetate, and styrene can be polymerized by an electric field. Heretofore, however, the polymerizable materials had first to be dissolved in a solvent such as dimethylformamide containing a salt such as potassium nitrate or tetramethylammonium perchlorate to confer conductivity. See, for example, U.S. Pat. No. 3,193,475 to Baizer. Complex purification techniques are required to recover the product.

SUMMARY OF THE INVENTION

It is, therefore, an object of this invention to provide a system for polymerizing unsaturated organic compounds which overcomes the above-noted disadvantages.

It is another object of this invention to provide a system for polymerizing unsaturated organic compounds in an electric field.

It is another object of this invention to provide a system for polymerizing unsaturated organic compounds which does not require heat or thermally decomposed initiators.

It is another object of this invention to provide a system for polymerizing unsaturated organic compounds in an electric field which does not require vaporization of one or more of the polymerizable materials.

It is another object of this invention to provide a system for polymerizing unsaturated organic compounds in the liquid phase in an electric field which does not require the use of comparatively conductive media.

It is another object of this invention to provide a system for polymerizing unsaturated organic compounds which is relatively simple and does not require relatively complex recovery or purification steps.

It is another object of this invention to provide a system for polymerizing unsaturated organic compounds in an electric field in image configuration.

It is another object of this invention to provide a system for polymerizing unsaturated organic compounds in an electric field in image configuration which does not require light sources.

The foregoing objects and others are accomplished in accordance with this invention by a system comprising placing a liquid polymerizable unsaturated organic compound or mixture of such compounds in an electroded system. Application of a potential difference across the polymerizable composition apparently causes a small current to flow into the polymerizable compound or mixture of such compounds effecting polymerization. Although the exact mechanism of the polymerization reaction is not fully understood it is possible that injection of electrons into the polymerizable material initiates polymerization. Because a small flow of electrons apparently passes into the polymerizable mixture, the process is referred to as charge injection polymerization. When the desired amount of polymer has been formed, polymerization is stopped by removing the source of the potential difference. The electrodes are then separated. The electrode or electrodes which has the polymer adhering to it may then be flushed to remove any unpolymerized material remaining. The electrode with the polymer adhering to it may then be used for example as a relief printing plate or lithographic master where the field was applied imagewise. The process may also be used to produce braille type relief images or polymer sheets or film. The process is also useful for coating metallic materials such as wire, nails, and for making printed circuits. One main advantage of the present invention for coating over conventional coating techniques is that no solvents or electrolytes need be used which invariably create pollution problems. To provide imagewise polymerization one of the electrodes may comprise an insulating substrate having a conductive material on it in image configuration. Here, the image preferably is continuous or electrically connected so that potential is applied at all parts of the image. Preferably, however, one of the conductive electrodes is masked by an insulating material in image configuration since a material such as a photo resist may be used which can be conveniently applied to the electrodes in image configuration.

It should be understood that for the purposes of this disclosure, by polymerization is meant addition polymerization and is intended also to include the cross-linking of polyfunctional polymers and monomers.

Any suitable conductive electrode material may be used. Typical conductive electrode materials include: metal surfaces such as aluminum, brass, stainless steel, copper, nickel, zinc, etc., conductively coated glass such as tin or indium oxide coated glass, aluminum coated glass, similar coatings on plastic substrates or paper rendered conductive by the inclusion of a suitable chemical therein or through conditioning in a humid atmosphere to ensure the presence therein of sufficient water content to render the material conductive. NESA (tin oxide coated glass available from the Pittsburgh Plate Glass Company) electrodes are preferred because being transparent they allow direct observation of the polymerization.

Where a conductive electrode is to be masked by an insulator in image configuration the insulating masking material may be of any suitable material. Typical insulating masking materials include: photoresist compounds such as those disclosed in U.S. Pat. No. 3,143,423 to Reynolds, Van Allan and Borden; and non-photopolymerized polymers such as non-self-supporting or self-supporting films or organic resins, plastics, binders including cellulose, cellulosic materials, and insulating resins such as lacquer coatings and resin films and layers including urea and melamine-type resins and vinyl and acrylic resins and mixtures thereof. The only requirement for the insulative masking is that it be a significantly better insulator than the electrode on which it is formed. Photoresist compounds are preferred because of the relative ease with which images may be formed. The processes for placing photo resist materials on glass, paper or metals in image configuration are known in the art. See, for example, U.S. Pat. No. 2,610,120 to Minsk, Van Deusen and Robertson.

Where an insulating substrate is to be overcoated in image configuration with a conductive material, the conductor may be any suitable material. Typical conductive materials include: copper, aluminum, chromium and platinum all of which are commonly vacuum deposited on polymeric substrates such as those listed below and brass, stainless steel, nickel, zinc and mixtures thereof.

Where an insulating substrate is to be coated in image configuration with a conductive material the insulating substrate may be of any suitable material. Typical insulating materials include: glass, phenolics, polyesters, acrylonitrile-butadiene-styrene copolymers, polycarbonates, polyethylene, polypropylene, vinyl, acrylics, polystyrenes, paper, rubber and mixtures thereof.

Any suitable unsaturated organic monomer or polymer or mixtures thereof may be used. Typical monofunctional monomers include: N-vinylphthalimide, methyl methacrylate, N-vinylcarbazole dissolved in for example acetonitrile or acrylonitrile, N-vinyl pyrrolidone, acrylates such as ethyl acrylate, butyl acrylate, acrylate esters and mixtures thereof. Typical unsaturated multifunctional monomers include: (di), (tri), (tetra), ethylene glycol dimethacrylate, bis (p-methoxy benzal) acetone azine, bis (p-N,N'-dimethylaminobenzylidene) acetone, neopentyl glycol dimethacrylate, hexamethylene-bis-acrylamide, divinyl benzene, allyl methacrylamide, bisphenol A-dimethacrylate, N-N'-methylene bisacrylamide, (di), (tri), (tetra), ethylene glycol acrylate, neopentyl glycol diacrylate, bisphenol A-diacrylate,$\alpha,\beta$unsaturated ketones (chalcones) and mixtures thereof.

Typical multifunctional unsaturated polymers include: bis-acrylates and methacrylates of polyethylene glycols, such as polyethylene glycol dimethacrylate; unsaturated esters of polyols, condensation products of 4'-($\beta$-hydroxyethoxy)-chalcone with a styrene/maleic-anhydride copolymer or other maleic anhydride copolymers and mixtures thereof. Other typical multifunctional unsaturated monomers and polymers are disclosed at column 8, line 43, through column 9, line 15 of U.S. Pat. No. 3,060,025 to Burg, Muchen and Cohen. A mixture of 7 parts ethylene glycol dimethacrylate (EGDMA) and 3 parts of Atlas 1086 (bisphenol A-epichorohydrin esterified with fumaric acid, available from Atlas Chemical Industries, Inc. Wilmington, Del.) is preferred because it polymerizes readily at a relatively low applied potential. EGDMA is a polymerizable multifunctional monomer, that is, it is a monomer which has more than one site of unsaturation and is therefore capable of rapidly cross-linking the Atlas 1086. Atlas 1086 is a low molecular weight multifunctional polymerizable material which does not require extensive cross-linking before it forms an insoluble resin with EGDMA.

BRIEF DESCRIPTION OF THE DRAWINGS

The advantages of this improved method of polymerizing unsaturated organic compounds or mixtures of such compounds will become apparent upon consideration of the detailed disclosure of the invention, especially when taken in conjunction with the accompanying drawings wherein:

Referring now to FIG. 1, a NESA glass plate 1 having a photoresist masking material formed on it in image configuration 3 is used as the master electrode. A Teflon (polytetrafluoroethylene available from duPont) gasket 4 is placed over the master electrode. The shallow cup formed by the Teflon gasket and master electrode is filled with a polymerizable material 5. A second NESA glass electrode 2 is placed over the mixture of polymerizable compounds and the Teflon gasket. A source 6 of potential difference is then attached to the electrodes: the second NESA glass electrode 2 is made the negative electrode in the cell. The potential is applied until the desired depth of polymer 7 is obtained. Polymer is formed on those areas of the negative electrode directly opposite the non-masked areas of the conductive master electrode.

Referring now to FIG. 2, a substrate 8 of molded polycarbonate having aluminum 10 in image configuration, and electrically continuous vacuum deposited on it is used as the master electrode. Processes for vacuum depositing metals on plastics are well known. See, for example, Modern Plastics Encyclopedia 1966, page 998. A Teflon gasket 11 is placed over the master electrode 8. The shallow cup formed by the Teflon gasket and master electrode is filled with a polymerizable material 12. An aluminum electrode 9 is placed over the mixture of polymerizable compounds and the Teflon gasket. A source 13 of potential difference is then attached to image 10 and electrode 9. The potential is applied until the desired depth of polymer 14 is obtained. Polymer 14 is formed on those areas of the aluminum electrode 9 which are directly opposite the conductive image on the master electrode.

DESCRIPTION OF THE PREFERRED EMBODIMENTS

Figure 1:
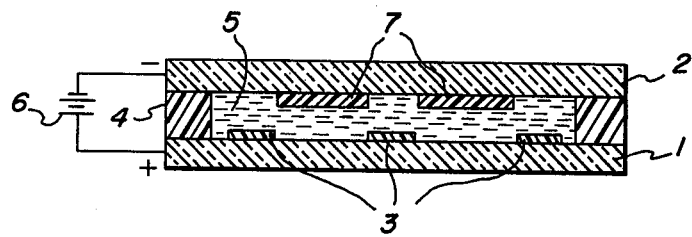
FIG. 1 shows a side view of simple exemplary system for carrying out the process of this invention wherein a conducting "master" electrode with an insulating masking material in image configuration on its surface is used for polymerizing in image configuration.
Figure 2:
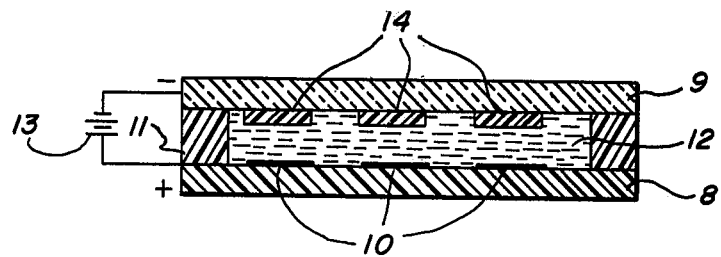
FIG. 2 shows a side view of a simple exemplary system for carrying out the process of this invention wherein an insulating master electrode having a conductive masking material in image configuration on its surface is used for polymerizing in image configuration.

The following examples further specifically illustrate the present invention. The examples below are intended to illustrate the various preferred embodiments of the improved polymerization method. The parts and percentages are by weight unless otherwise indicated.

EXAMPLE I

A 2 inch square by 1/8 inch thick NESA glass plate is prepared by placing Kodak Photoresist (available from the Eastman Kodak Company of Rochester, N.Y.) and described generally as the cinnamate esters of polyvinyl alcohol and of cellulose on it in image configuration. This electrode is referred to as the master electrode. A 10 mil thick Teflon gasket having a 2 inch square hole is placed over the master electrode. The 10 mil deep "cup" formed by the Teflon gasket and the master electrode is filled with a polymerizable mixture consisting of about 7 parts of ethylene glycol dimethacrylate and about 3 parts of Atlas 1086 (bisphenol A-epichlorohydrin esterified with fumaric acid). A second 2 inch square by 1/8 inch thick NESA plate is then placed over the Teflon gasket and mixture of polymerizable materials. A potential source of 1,200 volts d.c. is connected to the two electrodes. A higher potential than 1,200 volts would result in faster polymerization, however, control of the extent of polymerization i.e., depth of the polymer on the negative electrode would not be as accurate, the potential difference is limited by the break-down voltage of the compound or mixture of compounds being polymerized. The master electrode is made the positive electrode in the cell. Initially, the current flow between the two electrodes measures 0.3 milliamperes. This small current flow initiates polymerization at the surface of the negative electrode. The flow of current decreases as the polymerization continues. Polymerization is continued for 2 minutes. The negative electrode is then removed from the cell and the polymer image bonded to the face of it flushed with acetone. Examination shows a raised polymeric image bonded to the surface of the NESA plate.

EXAMPLE II

A substrate made up of a 2 inch square by 3/8 inch thick piece of molded polycarbonate, made from the phosgenation of bisphenol A(4,4'-dihydroxydiphenyl-1-1-2-2'-propane), is prepared by vacuum depositing aluminum on its surface in image configuration. The aluminum image is continuous so that current will flow to all parts of the image. This electrode is referred to as the master electrode. A 10 mil thick Teflon gasket having a 2 inch square hole is placed over the master electrode. The 10 mil deep cup formed by the Teflon gasket and master electrode is filled with a polymerizable mixture consisting of about 7 parts of ethylene glycol dimethacrylate and about 3 parts of Atlas 1086. A 2 inch square by 1/16 inch thick aluminum plate is placed over the mixture of polymerizable compounds and the Teflon gasket. A potential difference of 1200 volts d.c. is applied between the two electrodes. The aluminum electrode is made the negative electrode in the cell. Application of potential causes a small current to flow into the polymerizable mixture initiating polymerization at the surface of the aluminum electrode. Polymerization is continued for 2 minutes. The aluminum electrode is then removed from the cell and the polymer image bonded to it, flushed with acetone solvent. The aluminum plate with the polymer image bonded to it may be used as a relief printing plate.

EXAMPLE III

A 2 inch square by 1/8 inch thick NESA glass plate is used as the master electrode. A 10 mil thick Teflon gasket having a 2 inch square hole is placed over the master electrode. The 10 mil deep cup formed by the Teflon gasket and the master electrode is filled with a polymerizable mixture consisting of about 2 parts of divinyl benzene and about 1 part bis (p-N,N'-dimethylamino benzal) acetone. A 2 inch square by 1/16 inch thick aluminum electrode is then placed over the Teflon gasket and mixure of polymerizable materials. A potental source of 1200 volts is connected to the two electrodes. The master electrode is made the positive electrode in the cell. The potential is applied for 5 minutes. The electrodes are then separated. The polymer may be removed from the electrode by scraping lightly with a blade.

EXAMPLE IV

A 2 inch square by 1/8 inch thick NESA glass plate is prepared by placing a photoresist material on it in image configuration. This electrode is referred to as the master electrode. A 10 mil Teflon gasket having a 2 inch square hole is placed over the master electrode. The 10 mil deep cup formed by the Teflon gasket and the master electrode is filled with a polymerizable mixture consisting of about 7 parts of neopentyl glycol dimethylacrylate and about 3 parts Atlas 1086 (bisphenol A-epichlorohydrin esterified with fumaric acid). A 2 inch square by 1/16 inch thick aluminum plate is then placed over the Teflon gasket and mixture of polymerizable materials. A potential source of 1200 volts d.c. is connected to the two electrodes. The master electrode is made the positive electrode in the cell. The potential is applied for 2 minutes. The aluminum electrode is removed from the cell and flushed with acetone. The aluminum electrode with the polymer image bonded to it may be used as a relief printing plate.

EXAMPLE V 2,4-dicyanobutene-1 is polymerized as in Example IV. The aluminum electrode is removed from the cell and flushed with acetone. The aluminum electrode with the polymer image bonded to it may be used as a relief printing plate.

EXAMPLE VI

The experiment of Example I is repeated except that a 36 mil Teflon spacer is used and 800 volts is applied. The polymerizable composition consists of methyl methacrylate. A polymeric relief image is found adhering to the NESA electrode.

EXAMPLE VII

The experiment of Example II is repeated except that a 36 mil Teflon spacer is used and 800 volts is applied the polymerizable composition consists of methyl methacrylate. A polymeric relief image is found adhering to the aluminum plate.

EXAMPLE VIII

The experiment of Example VI is repeated except that the polymerizable composition comprises about 1 part of N-vinylcarbazole dissolved in about 4 parts of acrylonitrile. An image is found adhering to the NESA electrode.

Although specific components and proportions have been stated in the above description of preferred embodiments of the invention, other typical materials as listed above if suitable may be added to the mixture to synergize, enhance or otherwise modify the properties of the polymer, electrodes and the polymerizable mixture. For example, a diaphragm may be placed between the two electrodes to prevent migration of polymer to the opposite electrode.

Other modifications and ramifications of the present invention will occur to those skilled in the art upon a reading of the disclosure. These are intended to be included within the scope of this invention.

What is claimed is:

1. The method of forming an image comprising:
   a. providing, between and in contact with at least two electrodes, one of said electrodes being in imagewise configuration, a liquid, polymerizable composition comprising unsaturated vinyl containing compounds capable of undergoing liquid to solid addition polymerization in response to application of an electrical field across said polymerizable composition; and
   b. in the absence of chemical initiators, catalysts and electrolytes, applying an imagewise configured electrical field across said polymerizable composition to polymerize said composition until an image is formed.

2. The method of claim 1 wherein said polymerizable composition comprises a mixture of neopentyl glycol dimethacrylate and bisphenol A-epichlorohydrin esterified with fumaric acid.

3. The method of claim 1 wherein said polymerizable composition comprises methyl methacrylate in a solvent.

4. The method of claim 1 wherein said polymerizable composition comprises a mixture of polyethylene glycol dimethacrylate and bisphenol A-epichlorohydrin esterified with fumaric acid.

5. The method of claim 1 wherein said polymerizable composition comprises a mixture of ethylene glycol dimethacrylate and bisphenol A-epichlorohydrin esterified with fumaric acid.

6. The method of claim 1 wherein said polymerizable composition comprises N-vinylcarbazole in either acetonitrile or acrylonitrile.

7. The method of claim 1 wherein said liquid, polymerizable composition contains monofunctional monomers.

8. The method of claim 1 wherein said liquid, polymerizable composition contains multifunctional compounds.

* * * * *